(12) United States Patent
Liao

(10) Patent No.: US 9,018,062 B2
(45) Date of Patent: Apr. 28, 2015

(54) WAFER STRUCTURE AND POWER DEVICE USING THE SAME

(71) Applicant: Silergy Semiconductor Technology (Hangzhou) Ltd, Hangzhou, ZheJiang Province (CN)

(72) Inventor: Zhongping Liao, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 0 days.

(21) Appl. No.: 14/170,731

(22) Filed: Feb. 3, 2014

(65) Prior Publication Data

US 2014/0252553 A1   Sep. 11, 2014

(30) Foreign Application Priority Data

Mar. 5, 2013   (CN) .......................... 2013 1 0069766

(51) Int. Cl.
| | | |
|---|---|---|
| H01L 21/336 | (2006.01) | |
| H01L 21/8224 | (2006.01) | |
| H01L 29/80 | (2006.01) | |
| H01L 29/94 | (2006.01) | |
| H01L 29/36 | (2006.01) | |
| H01L 21/18 | (2006.01) | |

(52) U.S. Cl.
CPC ................ *H01L 29/36* (2013.01); *H01L 21/18* (2013.01)

(58) Field of Classification Search
CPC . H01L 27/085; H01L 27/088; H01L 29/8083; H01L 29/1608; H01L 29/7818; H01L 29/7835; H01L 29/7802; H01L 29/7827; H01L 29/7813; H01L 29/735; H01L 26/586

USPC .......................... 257/262, 263, 328, 329, 335; 438/268–272, 316, 336
See application file for complete search history.

(56) References Cited

U.S. PATENT DOCUMENTS

| | | | |
|---|---|---|---|
| 5,637,898 A * | 6/1997 | Baliga ............................ | 257/330 |
| 6,476,442 B1 * | 11/2002 | Williams et al. .............. | 257/328 |
| 7,772,668 B2 * | 8/2010 | Pan ................. | 257/492 |
| 8,120,391 B2 * | 2/2012 | Bayerer et al. ................ | 327/108 |
| 8,574,962 B2 | 11/2013 | Nakata et al. | |
| 8,779,509 B2 * | 7/2014 | Schulze et al. ................ | 257/333 |
| 2006/0071295 A1 * | 4/2006 | Chang ............................ | 257/510 |
| 2007/0146020 A1 * | 6/2007 | Williams ....................... | 327/110 |
| 2009/0196041 A1 * | 8/2009 | Joseph et al. .................. | 362/276 |
| 2010/0187604 A1 * | 7/2010 | Ono et al. ...................... | 257/335 |
| 2010/0301410 A1 | 12/2010 | Hirler | |
| 2011/0018005 A1 | 1/2011 | Nakano | |
| 2012/0168819 A1 | 7/2012 | Marino et al. | |
| 2012/0276701 A1 | 11/2012 | Yedinak | |
| 2013/0026560 A1 * | 1/2013 | Onishi et al. ................... | 257/329 |

(Continued)

FOREIGN PATENT DOCUMENTS

CN   102938421 A   2/2013

*Primary Examiner* — Hsien Ming Lee
(74) *Attorney, Agent, or Firm* — Michael C. Stephens, Jr.

(57) ABSTRACT

In one embodiment, a method of making a super-junction MOS transistor in a wafer can include: (i) forming a first doping layer having a high doping concentration; (ii) forming a second doping layer on the first doping layer, wherein a doping concentration of the second doping layer is less than a doping concentration of the first doping layer; (iii) forming a third doping layer on the second doping layer, wherein the third doping layer comprises an intrinsic layer; (iv) etching through the third doping layer and partially through the second doping layer to form trenches; and (v) filling the trenches to form pillar structures.

20 Claims, 9 Drawing Sheets

(56) References Cited

U.S. PATENT DOCUMENTS

| | | |
|---|---|---|
| 2013/0196457 A1 | 8/2013 | Nakajima et al. |
| 2013/0217185 A1 | 8/2013 | Wisotzki et al. |
| 2014/0231912 A1* | 8/2014 | Willmeroth et al. .......... 257/339 |

* cited by examiner (a)

(b)

US 9,018,062 B2

WAFER STRUCTURE AND POWER DEVICE USING THE SAME

RELATED APPLICATIONS

This application claims the benefit of Chinese Patent Application No. 201310069766.0, filed on Mar. 5, 2013, which is incorporated herein by reference in its entirety.

FIELD OF THE INVENTION

The present invention relates to the field of semiconductor devices, and more particularly to a wafer structure and power devices fabricated in the wafer structure.

BACKGROUND

A switched-mode power supply (SMPS), or a "switching" power supply or voltage regulator, can include a power stage circuit and a control circuit. The power stage circuit can include one or more power devices. When an input voltage is applied, the control circuit can consider internal parameters and external load changes, and may regulate the on/off times of the switch system in the power stage circuit. In this way, the output voltage and/or the output current of the switching power supply can be maintained as substantially constant. Elements in the power stage circuit and/or control circuit can be fabricated in a semiconductor wafer.

SUMMARY

In one embodiment, a wafer structure for a power device can include: (i) a first doping layer having a high doping concentration; (ii) a second doping layer on the first doping layer, where a doping concentration of the second doping layer is less than the high doping concentration; and (iii) a third doping layer on the second doping layer, where a doping concentration of the third doping layer is less than the doping concentration of the second doping layer. For example, the power device fabricated in such a wafer structure can be part of a switching voltage regulator.

In one embodiment, a method of making a super-junction MOS transistor in a wafer can include: (i) forming a first doping layer having a high doping concentration; (ii) forming a second doping layer on the first doping layer, wherein a doping concentration of the second doping layer is less than a doping concentration of the first doping layer; (iii) forming a third doping layer on the second doping layer, wherein the third doping layer comprises an intrinsic layer; (iv) etching through the third doping layer and partially through the second doping layer to form trenches; and (v) filling the trenches to form pillar structures.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
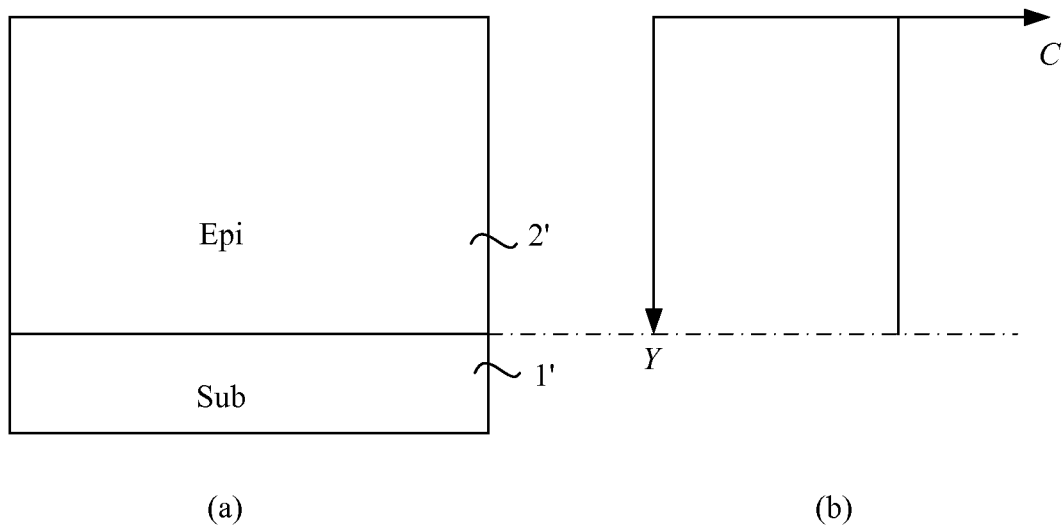
FIG. 1 is a diagram of an epitaxial structure and doping concentration distribution in a wafer structure.

In manufacturing power devices (e.g., for switching voltage regulators), one semiconductor wafer structure may include a high resistance layer (e.g., an epitaxial layer) extending from a relatively low resistance semiconductor substrate. Such a structure may tolerate relatively high voltages, and thus be suitable for power devices and/or circuitry. Further, the low resistance substrate, as a support, may not add undesirable or substantial resistance to the overall structure. FIG. 1 shows a diagram of an example epitaxial structure and doping concentration distribution in a wafer structure.

As shown in diagram (a) of FIG. 1, a wafer structure can include semiconductor substrate 1' and single-layered and uniformly doped epitaxial layer 2'. As shown in diagram (b) of FIG. 1, abscissa C may denote the doping concentration across doped epitaxial layer 2', and ordinate Y can denote the longitude depth, of epitaxial layer 2'. However, drawbacks of this structure as related to power devices can include difficulties in improving various terminal pressure parameters (e.g., breakdown voltage [BV]) of the power device, given such an epitaxial structure.

Figure 2:
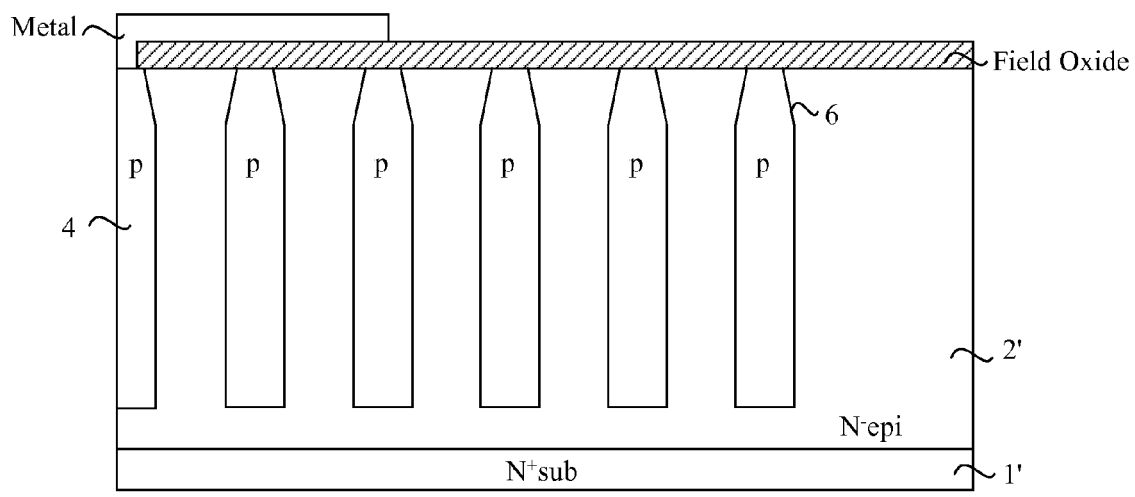
FIG. 2 is a cross-sectional diagram of a wafer structure applied for a longitude super-junction metal oxide field-effect transistor.

FIG. 2 is a cross-sectional diagram of a wafer structure applied for a longitude super-junction metal oxide field-effect transistor (MOSFET) power device. For example, this type of transistor can be manufactured by using a trench fill process. Due to the surface field oxide layer that may be formed during or along with processing epitaxial layer 2', n-type impurities in epitaxial layer 2' may accumulate at the surface. Thus, during formation of p-pillars 4 by filling p-type silicon in etched trenches, the p-type impurity on its surface portion may be at least partially neutralized. This can cause structure 6 to turn or gather inwards near the surface, as shown. Such a gathering inwards type of structure can cause a terminal of the super-junction MOS transistor to not properly extend to allow for full contact (e.g., a source region contact) at the surface, which can result in a relatively low breakdown voltage for the power device.

Figure 3:
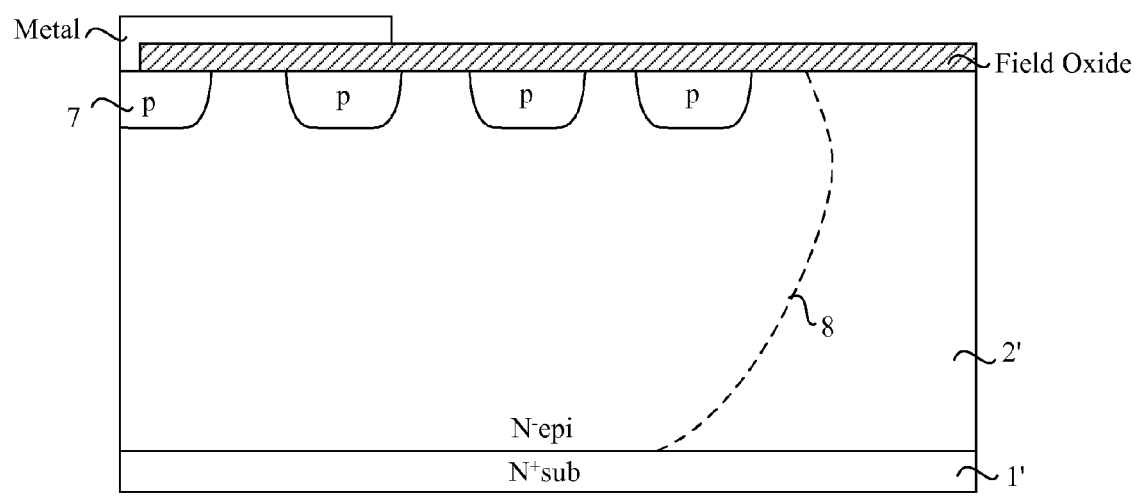
FIG. 3 is a cross-sectional diagram of a wafer structure applied for a vertical double diffused metal oxide semiconductor field-effect transistor.

Referring now to FIG. 3, shown is a cross-sectional diagram of a wafer structure applied for a vertical double diffused metal oxide semiconductor (VDMOS) field-effect transistor type of power device. For example, a drain contact can be placed under the device at the N+sub, and a source contact can be placed over the drain (e.g., over region 7). In this example structure, 7 can be a p-type region of the VDMOS, and 8 can be an edge of the N-epi layer extension or depletion layer. The subsequently formed terminal structure (e.g., for source region contacting) of this example may not tolerate high voltages (i.e., the withstand efficiency or breakdown voltage may be low), and accommodation of the terminal design for power device connectivity can be difficult.

In one embodiment, a wafer structure for a power device can include: (i) a first doping layer having a high doping concentration; (ii) a second doping layer on the first doping layer, where a doping concentration of the second doping layer is less than the high doping concentration; and (iii) a third doping layer on the second doping layer, where a doping concentration of the third doping layer is less than the doping concentration of the second doping layer. For example, the power device fabricated in such a wafer structure can be part of a switching voltage regulator.

Figure 4:
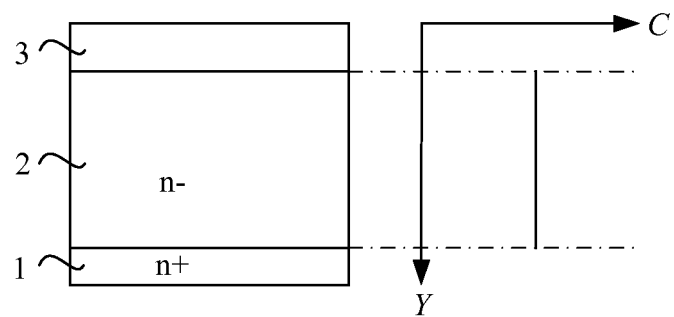
FIG. 4 is a diagram of a wafer structure with an example doping concentration distribution, in accordance with embodiments of the present invention.
Figure 4:
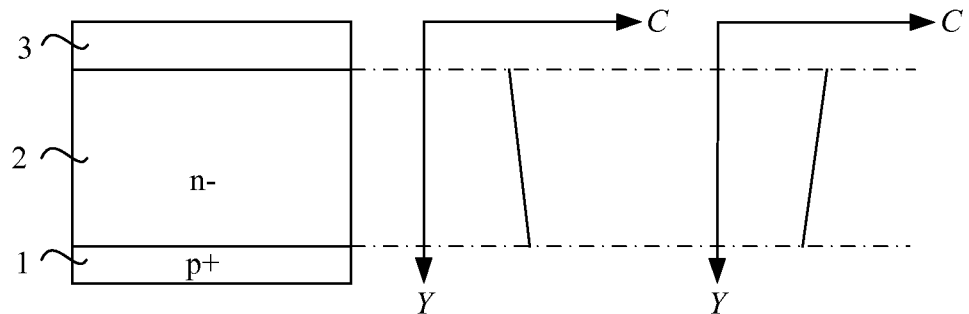

Referring now to FIG. 4, shown is a diagram of a wafer structure with an example doping concentration distribution (e.g., for doping layer 2), in accordance with embodiments of the present invention. This particular example can include doping layer 1, doping layer 2, and doping layer 3, which may be formed in sequence. For example, doping layer 1 can include a relatively high concentration doping (e.g., n+ or p+), and doping layer 2 may include a relatively low concentration doping (e.g., n− or p−). In some cases, doping layer 2 may have another or predetermined doping concentration, but can still be less than that of doping layer 1.

The doping concentration of doping layer 3 can be lower than that of doping layer 2. In some cases, doping impurities may not be purposefully added to doping layer 3, and as such doping layer 3 can be intrinsic material without any substantial doping impurity. Also, different distributions or profiles of doping concentrations, such as for doping layer 2, can be supported in particular embodiments. For example, the doping concentration of doping layer 2 may be distributed uniformly as shown in diagram (a) of FIG. 4, then indicated by a straight vertical line in the doping concentration profile across the region of doping layer 2.

Alternatively, the doping concentration of doping layer 2 may be changed continuously and/or gradiently, as shown in diagram (b) of FIG. 4, and as indicated by the sloped lines in the example doping concentration profiles. Thus in one such case, the doping concentration across doping layer 2 can be decreased in going from a border with doping region 1 to a border with doping region 3. In another such case, the doping concentration across doping layer 2 can be increased in going from a border with doping region 1 to a border with doping region 3. Also for example, the thickness of doping layer 2 can be greater than the thickness of doping layer 3. In some cases, the thickness of doping layer 2 can be substantially thicker than (e.g., 4-5 times, or 10 times, as thick as) that of doping layer 3.

In particular embodiments, the type of the impurity (e.g., n-type or p-type) of doping layer 2 may be the same type of the impurity (e.g., both n-type, or both p-type) as that of doping layer 1. Alternatively, the impurity types of doping layers 1 and 2 may be opposite types (e.g., n-type for one, and p-type for the other). As shown in the particular examples of FIG. 4, when the doping type of doping layer 2 is n-type, the corresponding doping type of doping layer 1 can be n+ doping or p+ doping. In some cases, the particular doping types and/or arrangements may depend on specific requirements (e.g., specifications and types) of the power device fabrication in the wafer structure.

In particular embodiments, doping layer 1 can be used as the substrate of the semiconductor, and doping layers 2 and 3 can be utilised as epitaxial layers that may be grown sequentially and epitaxially thereon. In any case, the basic materials (e.g., semiconductor materials, impurities, etc.) can remain consistent or common among different configurations. For example, the semiconductor substrate (e.g., doping layer 1) can be silicon that is heavily-doped with arsenic or phosphorus, doping layer 2 can be silicon epitaxy with lightly-doped phosphorus, and doping layer 3 can be intrinsic doping silicon epitaxy.

Certain embodiments can also provide a power device (e.g., a power transistor) that utilises or is fabricated in a wafer structure as described herein. In particular, one or more active regions can be formed in the wafer structure for the power device. Any such power device (e.g., a metal oxide semiconductor field-effect transistor [MOSFET], an insulated gate bipolar transistor [IGBT], a diode, etc.) can be employed in particular embodiments, and may be included in a switching voltage regulator or switched-mode power supply (SMPS). As will be described below, super-junction MOSFET and vertical double diffused metal oxide semiconductor field-effect transistors will be used as examples to describe the wafer structure and advantages of the power device formed therein.

Figure 5:
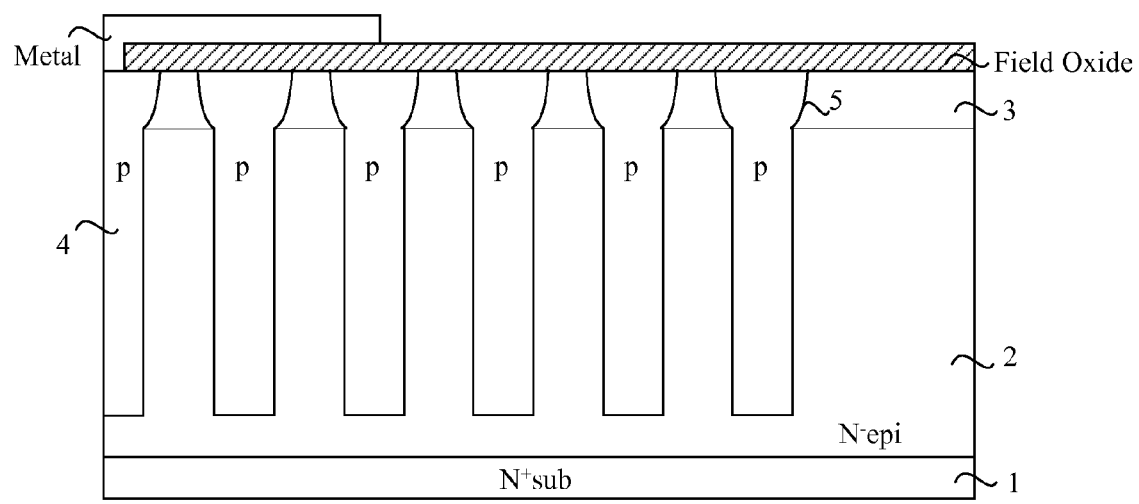
FIG. 5 is a cross-sectional diagram of a wafer structure applied for a longitude super-junction metal oxide field-effect transistor, in accordance with embodiments of the present invention.

Referring now to FIG. 5, shown is a cross-sectional diagram of a wafer structure applied for a longitude super-junction metal oxide field-effect transistor, in accordance with embodiments of the present invention. For example, doping layer 1 can be an n-type heavily doped silicon substrate, and doping layer 2 can be n-type material with relatively light doping. Also, the doping concentration of doping layer 2 can be uniformly distributed in this particular example. Further, doping layer 3 can include intrinsic doping (e.g., substantially no impurities), or be an intrinsic layer. The super-junction MOS transistor fabrication can also include a trench filling process. For example, p-pillar structure 4 can be formed by p-type silicon filled in trenches that are formed by etching. In addition, an oxide layer (e.g., field oxide) and a metal layer (e.g., aluminum) can be formed on a surface of p-pillar structures 4/5 and doping layer 3.

Because the region of doping layer 3 may be intrinsic or without substantial doping impurity, the p-type silicon can form a "bowl" structure 5 at doping layer 3. Such a bowl or curved extension structure to p-pillars 4 can be formed due to high-temperature diffusion of the p-type impurities during the fabrication process. In this way, the surface of the terminal structure of the super-junction MOS transistor can be extended in surface area, thus potentially improving the breakdown voltage by accommodating sufficient contacting and/or subsequent layers and/or connectivity. As such, a power device using such a wafer structure may have increased process tolerance, as well as higher terminal (e.g., source/drain contacting) reliability.

Figure 6:
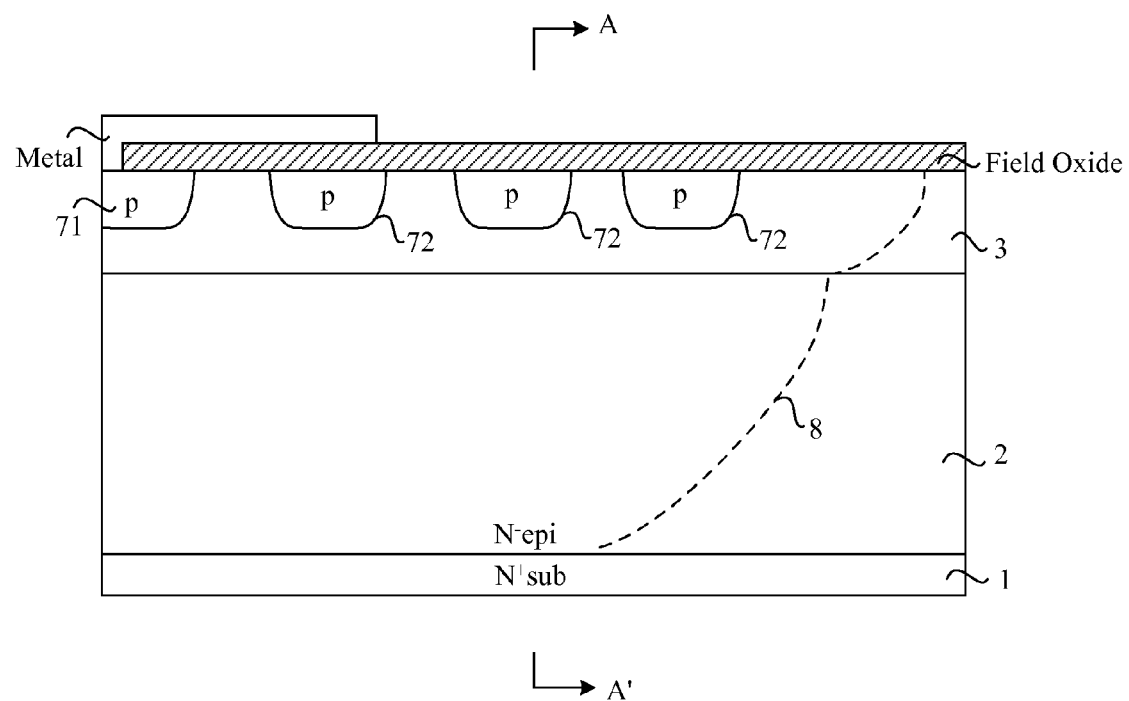
FIG. 6 is a cross-sectional diagram of a wafer structure applied for a vertical double diffused metal oxide semiconductor field-effect transistor, in accordance with embodiments of the present invention.

Referring now to FIG. 6, shown is a cross-sectional diagram of a wafer structure applied for a vertical double diffused metal oxide semiconductor (VDMOS) field-effect transistor type of power device, in accordance with embodiments of the present invention. In this example, 71 can be an equipotential ring formed by a p-type region, and 72 can be a floating (e.g., not tied to a particular potential) ring. When doping layer 3 bears a relatively high voltage, its depletion layer can expand at the surface, and this can change the curvature of depletion layer 8. At doping layer 3, the decrease of curvature of depletion layer 8 can reduce the electric field of the p-n junction, thus improving the breakdown voltage of the power device.

Figure 7:
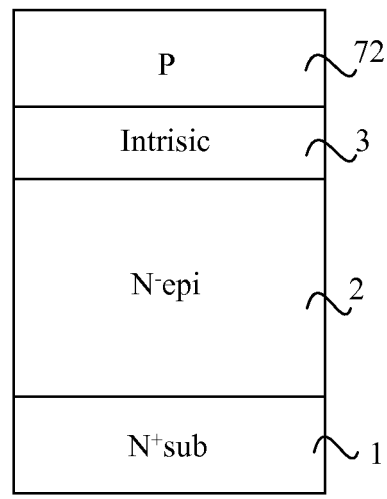
FIG. 7 is a cross-sectional diagram of the example VDMOS structure of FIG. 6 along direction AA', in accordance with embodiments of the present invention.

Referring now to FIG. 7, shown is a cross-sectional diagram of the example VDMOS structure of FIG. 6 along direction AA', in accordance with embodiments of the present invention. Here, the floating ring and wafer structure of FIG. 6 can form a PIN-N+ structure. Due to the intrinsic doping of layer 3, the breakdown voltage of the floating ring 71 can be improved, as compared to other wafer structures. Thus, the longitude withstand or breakdown voltage of the power device due to the terminal characteristics (e.g., source/drain connection) can be further improved. Similarly, the epitaxial structure of devices of particular embodiments may also be suitable for diodes or other junction-based devices, in addition to transistors.

Figure 8:
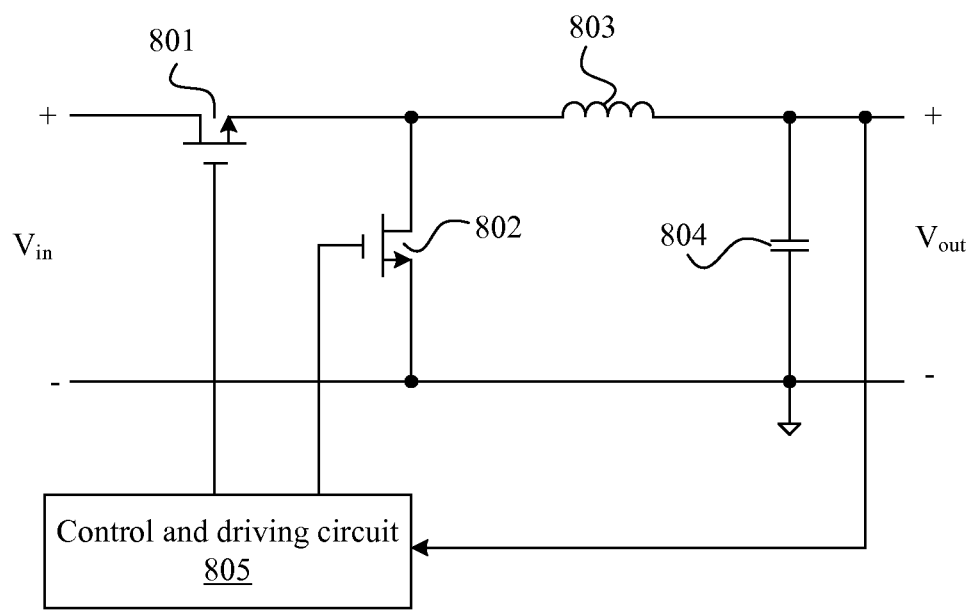
FIG. 8 is a schematic diagram of an example synchronous switching voltage regulator, in accordance with embodiments of the present invention.

Referring now to FIG. 8, shown is a schematic diagram of an example switching voltage regulator that utilises power devices. A switching voltage regulator is just one example of the circuitry that can be wholly or partially fabricated in the wafer structure of particular embodiments. In this example, power transistors 801 and 802, inductor 803, and capacitor 804 can form a synchronous buck power stage circuit. In other cases, other types of power stage or converter circuits (e.g., flyback, SEPIC, boost, buck-boost, etc.) can be formed. Control and driving circuit 805 (e.g., including a pulse-width modulation [PWM] controller) can receive an output signal of the power stage circuit, to form a closed-loop feedback control loop to control the switching state of power transistors 801 and 802. In this way, the output signal of the power stage circuit can be controlled to be substantially constant.

Of course, other integration or grouping of circuitry into different chips, ICs, or wafers can be accommodated in particular embodiments. In one example, a multi-chip packaging structure in particular embodiments can include power transistors 801 and 802 being integrated into a power device chip, and control and driving circuit 805 being integrated into a control chip. Since the power device may process a high voltage and/or a high current, the power device chip with a large area can be able to withstand a relatively high voltage and a relatively high current. Also, the power device may have good thermal characteristics for power supply integration.

For the integrated circuit of the switching voltage regulator shown in FIG. 8, if the carrying capacity of power transistor 802 is greater than that of power transistor 801, power transistor 802 may be much larger than power transistor 801. Thus, power transistor 802 (e.g., the synchronous power device) can be integrated in a single synchronous power device chip, and power transistor 801 (e.g., the main power device) as well as control and driving circuit 805 can be integrated in another single mixed chip. Further, power transistors 801 and/or 802 can be any suitable types of transistors or devices (e.g., super-junction MOS transistors, VDMOS, LDMOS, etc.).

In one embodiment, a method of making a super-junction MOS transistor in a wafer can include: (i) forming a first doping layer having a high doping concentration; (ii) forming a second doping layer on the first doping layer, wherein a doping concentration of the second doping layer is less than a doping concentration of the first doping layer; (iii) forming a third doping layer on the second doping layer, wherein the third doping layer comprises an intrinsic layer; (iv) etching through the third doping layer and partially through the second doping layer to form trenches; and (v) filling the trenches to form pillar structures.

Figure 9:
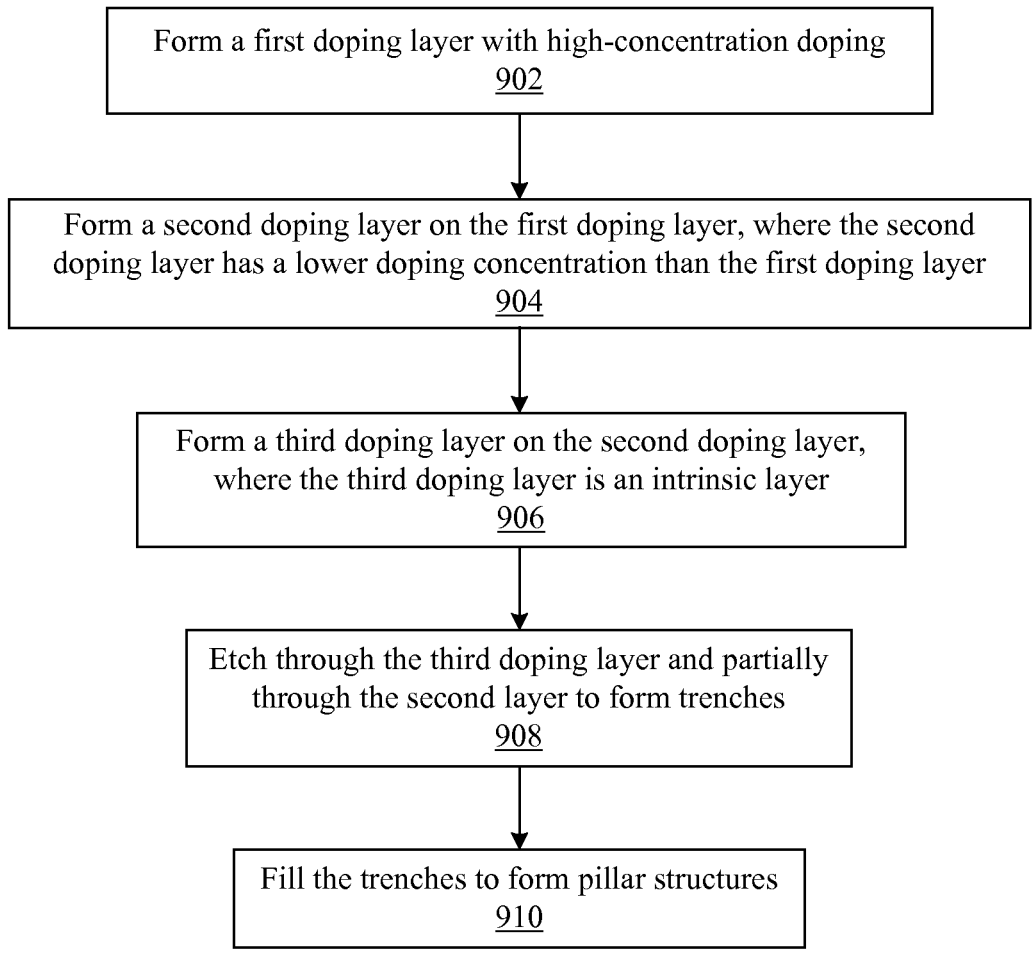
FIG. 9 is a flow diagram of an example method of making a transistor in a wafer structure in accordance with embodiments of the present invention.

Referring now to FIG. 9, shown is a flow diagram of an example method of making a transistor in a wafer structure in accordance with embodiments of the present invention. For example, this particular method can be used to fully or partially make a structure for a super-junction MOS transistor, as shown above in FIG. 5. At 902, a first doping layer with high concentration doping can be formed. For example, n-type impurities can be heavily doped into a silicon substrate to form the first doping layer (e.g., N+sub).

At 904, a second doping layer can be formed on the first doping layer. For example, n-type impurities can be lightly doped to form an N-epi layer. The doping concentration of the second doping layer can be less than that of the first doping layer. The doping concentration in this second layer can be uniformly distributed, or in some cases gradiently distributed. At 906, a third doping layer can be formed on the second doping layer. For example, the third doping layer can be an intrinsic or undoped material, or in any event can have a doping concentration that is less than that of the second doping layer. Also, the second doping layer can have a thickness greater than that of the third doping layer.

At 908, etching can be performed through the third doping layer and partially through the second doping layer to form trenches. The etching process can chemically remove layers or portions of layers from the surface of a wafer during manufacturing. For many etch steps, part of the wafer can be protected from the etchant by a "masking" material (e.g., patterned photoresist, silicon nitride, etc.) that resists etching. Any suitable type of etching (e.g., wet etching, dry etching, plasma etching, etc.) can be employed to form the trenches in particular embodiments.

At 910, the trenches can be filled to form the pillar structures. For example, the trenches can be filled with a p-type silicon material. A bowl type structure can be formed near the top of the trench in the third doping layer. A field oxide (FOX) layer can be grown or deposited on the surface of the filled trenches and the third doping layer. In addition, metal (e.g., aluminum) can be deposited on the field oxide layer. Further, the metal can form connections (e.g., to one or more pillar structures, such as by way of vias and/or contacts. In this way, connections between the transistor structure (e.g., at a terminal) and one or more other circuits fabricated on the wafer can be made.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A wafer structure for a power device, the wafer structure comprising:
    a) a first doping layer having a high doping concentration;
    b) a second doping layer on said first doping layer, wherein a doping concentration of said second doping layer is less than said high doping concentration;

c) a third doping layer on said second doping layer, wherein a doping concentration of said third doping layer is less than said doping concentration of said second doping layer; and d) pillar structures extending through said third doping layer and partially through said second doping layer, wherein each of said pillar structures comprises a bowl structure extending an entire thickness of said third doping layer.

2. The wafer structure of claim 1, wherein said third doping layer comprises an intrinsic layer.

3. The wafer structure of claim 1, wherein said doping concentration of said second doping layer is uniformly distributed.

4. The wafer structure of claim 1, wherein said doping concentration of said second doping layer is gradiently distributed.

5. The wafer structure of claim 1, wherein a type of impurity of said second doping layer is the same as a type of impurity of said first doping layer.

6. The wafer structure of claim 1, wherein a type of impurity of said second doping layer is different than a type of impurity of said first doping layer.

7. The wafer structure of claim 1, wherein said second and third doping layers are formed by epitaxial growth on said first doping layer.

8. A switching voltage regulator, comprising:
a) said wafer structure of claim 1; and
b) said power device formed in said wafer structure.

9. The switching voltage regulator of claim 8, wherein said power device comprises a metal oxide semiconductor field-effect transistor (MOSFET).

10. The switching voltage regulator of claim 9, wherein said MOSFET comprises a longitude super-junction metal oxide field-effect transistor or a vertical double diffused metal oxide semiconductor field-effect transistor.

11. The switching voltage regulator of claim 10, wherein said longitude super-junction metal oxide field-effect transistor is manufactured by a trench fill process.

12. The switching voltage regulator of claim 9, wherein said MOSFET comprises a vertical double diffused metal oxide semiconductor field-effect transistor.

13. The switching voltage regulator of claim 8, wherein said power device comprises an insulated gate bipolar transistor (IGBT).

14. The switching voltage regulator of claim 8, wherein said power device comprises a diode.

15. A method of making a super-junction MOS transistor in a wafer, the method comprising:
a) forming a first doping layer having a high doping concentration;
b) forming a second doping layer on said first doping layer, wherein a doping concentration of said second doping layer is less than a doping concentration of said first doping layer;
c) forming a third doping layer on said second doping layer, wherein said third doping layer comprises an intrinsic layer;
d) etching through said third doping layer and partially through said second doping layer to form trenches; and
e) filling said trenches to form pillar structures, wherein each of said pillar structures comprises a bowl structure extending an entire thickness of said third doping layer.

16. The method of claim 15, wherein said forming said first doping layer comprises heavily doping a silicon substrate with n-type impurities.

17. The method of claim 15, wherein said forming said second doping layer comprises lightly doping said second doping layer with n-type impurities.

18. The method of claim 15, wherein said filling said trenches comprises using silicon material with p-type impurities therein.

19. The method of claim 15, wherein said bowl structure in said third doping layer is configured to extend a terminal surface for a super-junction MOS transistor.

20. The method of claim 15, further comprising:
a) forming a field oxide on a surface of said pillar structures and said third doping layer; and
b) depositing a metal layer at least partially on said field oxide.

* * * * *